United States Patent
Lai

(10) Patent No.: US 9,627,372 B2
(45) Date of Patent: Apr. 18, 2017

(54) ELECTROSTATIC DISCHARGE PROTECTION DEVICE

(71) Applicant: NXP B.V., Eindhoven (NL)

(72) Inventor: Da-Wei Lai, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/172,192

(22) Filed: Jun. 3, 2016

(65) Prior Publication Data

US 2016/0372458 A1  Dec. 22, 2016

(30) Foreign Application Priority Data

Jun. 17, 2015 (EP) ..................... 15172569

(51) Int. Cl.
| | |
|---|---|
| H01L 27/06 | (2006.01) |
| H01L 27/02 | (2006.01) |
| H01L 29/08 | (2006.01) |
| H01L 29/735 | (2006.01) |

(52) U.S. Cl.
CPC ...... *H01L 27/0292* (2013.01); *H01L 27/0255* (2013.01); *H01L 27/0259* (2013.01); *H01L 27/0262* (2013.01); *H01L 29/0808* (2013.01); *H01L 29/0821* (2013.01); *H01L 29/735* (2013.01)

(58) Field of Classification Search
None
See application file for complete search history.

(56) References Cited

U.S. PATENT DOCUMENTS

| 6,246,079 B1 | 6/2001 | Chen |
| 2003/0052332 A1 | 3/2003 | Chen |
| 2004/0085691 A1 | 5/2004 | Ker et al. |
| 2005/0270710 A1 | 12/2005 | Ker et al. |
| 2006/0220137 A1* | 10/2006 | Kuroda ............... H01L 27/0262 257/361 |
| 2008/0013234 A1 | 1/2008 | Takahashi |

(Continued)

FOREIGN PATENT DOCUMENTS

WO  2011156233 A1  12/2011

OTHER PUBLICATIONS

Tseng et al., "ESD Protection Design for Low Trigger Voltage and High Latch-Up Immunity," 2010 17th IEEE International Symposium on the Physical and Failure Analysis of Integrated Circuits, 4 pages.

(Continued)

*Primary Examiner* — Minh-Loan Tran

(57) ABSTRACT

An ESD protection device for shunting an electrostatic discharge current from a first node to a second node, and an integrated circuit including the same. The device includes a first bipolar transistor having a collector and an emitter located in a first n-type region. The emitter of the first transistor is connected to the first node. The device also includes a second bipolar transistor having a collector and an emitter located in a second n-type region. The emitter of the second transistor is connected to the collector of the first bipolar transistor. The device further includes a pn junction diode including a p-type region located in a third n-type region. The p-type region of the diode is connected to the collector of the second bipolar transistor and the third n-type region is connected to the second node.

15 Claims, 8 Drawing Sheets

(56) References Cited

U.S. PATENT DOCUMENTS

| | | |
|---|---|---|
| 2010/0008002 A1 | 1/2010 | Sorgeloos |
| 2012/0091503 A1 | 4/2012 | Su |
| 2012/0119330 A1 | 5/2012 | Hwang |
| 2014/0049313 A1 | 2/2014 | Lai et al. |
| 2014/0159102 A1* | 6/2014 | Van Wijmeersch .... H01L 29/87 257/109 |
| 2014/0159108 A1* | 6/2014 | Marreiro ............ H01L 27/0248 257/140 |

OTHER PUBLICATIONS

Mergens et al., "High Holding Current SCRs (HHI-SCR) for ESD Protection and Latch-up Immune IC Operation," 2002 Electrical Overstress/Electrostatic Discharge Symposium, 2002. EOS/ESD '02, 8 pages.

Ker, Ming-Dou, "ESD Protection for CMOS ASIC in Noisy Environments with High-Current Low-Voltage Triggering SCR Devices," ASIC Conference and Exhibit, 1997. Proceedings., Tenth Annual IEEE International, pp. 283-286.

* cited by examiner

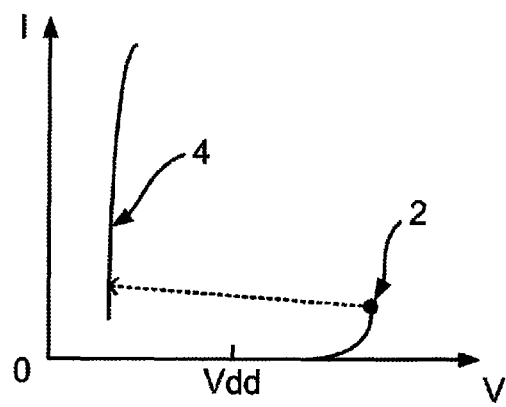
Fig. 1
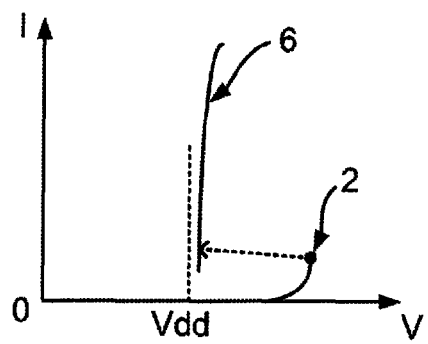 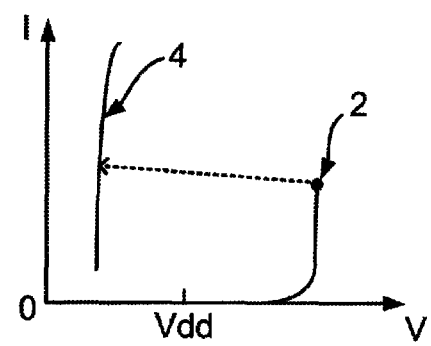
Fig. 2A  Fig. 2B

ELECTROSTATIC DISCHARGE PROTECTION DEVICE

CROSS-REFERENCE TO RELATED APPLICATIONS

This application claims priority under 35 U.S.C. §119 to European patent application no. EP15172569.4, filed Jun. 17, 2015, the contents of which are incorporated by reference herein.

FIELD OF THE INVENTION

This invention relates to an electrostatic discharge protection device for shunting an electrostatic discharge current from a first node to a second node. This invention also relates to an integrated circuit including such an electrostatic discharge protection device.

BACKGROUND OF THE INVENTION

Low voltage trigger silicon controlled rectifiers (LVTSCR) are often used as electrostatic discharge (ESD) protection devices because of their high performance and small size. LVTSCRs do have a number of drawbacks, however. For instance, they are prone to latch-up either during testing or caused by noise on the power bus of the circuit to be protected.

FIG. 1 shows the IV characteristics for a typical LVTSCR. As is known in the art of ESD protection devices, the LVTSCR has a trigger point 2 at which the snapback occurs. Thereafter, the LVTSCR operates in a holding region 4 to shunt the ESD current (e.g. to ground). As can be seen in FIG. 1, the holding region of a typical LVTSCR may be located below the supply voltage level (Vdd) of the circuit to be protected. Because of this, if the LVTSCR is triggered by a noise pulse during normal operation of the circuit, latch-up may occur, in which the LVTSCR does not deactivate. Latch-up generally leads to device failure.

There are two general approaches to addressing this problem, which are illustrated in FIGS. 2A and 2B. A first approach, shown in FIG. 2A, is to attempt to increase the holding voltage of the LVTSCR so that the holding region is located above the supply voltage (Vdd). In this way, if the LVTSCR is triggered by a noise pulse, it may subsequently deactivate. Another approach is to attempt to increase the trigger current of the LVTSCR as shown in FIG. 2B, so as to reduce the tendency for the LVTSCR to be triggered by a noise pulse.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided an electrostatic discharge protection device for shunting an electrostatic discharge current from a first node to a second node, the device comprising:

a first pnp bipolar transistor having a collector and an emitter located in a first n-type region in a semiconductor substrate, wherein the emitter of the first pnp transistor is connected to the first node;

a second pnp bipolar transistor having a collector and an emitter located in a second n-type region in the semiconductor substrate, wherein the emitter of the second pnp transistor is connected to the collector of the first pnp bipolar transistor, and a pn junction diode comprising a p-type region located in a third n-type region in the semiconductor substrate, wherein the p-type region of the pn junction diode is connected to the collector of the second pnp bipolar transistor and wherein the third n-type region is connected to the second node, wherein the second n-type region is separated from the third n-type region by a p-type region, wherein the p-type region is connected to the second node.

Embodiments of this disclosure may provide a device having trigger current that may be tuned by varying one or more characteristics (e.g. physical size) of the first pnp bipolar transistor. For instance, by increasing the total finger width of the first pnp bipolar transistor (so that a trigger current of the device may be increased), the device may be made increasingly resistant to latch-up during testing or caused by noise pulses during normal operation.

The n-type regions such as the first, second and third n-type regions may be n-type drift regions.

In one embodiment, the first pnp bipolar transistor may be larger (i.e. by physically larger) than the second pnp bipolar transistor. For instance, where the bipolar transistor have a construction having a number of fingers as will be described below in relation to FIG. 4, the total width of the fingers of the transistors may be varied so that the total width of the fingers of the first pnp bipolar transistor is larger than the total width of the fingers of the second pnp bipolar transistor. This approach may allow a trigger current of the device to be increased in a manner that need not increase the overall size of the device (e.g. in terms of the area occupied by the device on the semiconductor substrate). For a given trigger current, this approach may also allow the overall size of the device on the substrate to be reduced.

In one embodiment, the first n-type region of the first pnp bipolar transistor may be connected to the first node. In one embodiment, the second n-type region of the second pnp bipolar transistor may be connected to the collector of the first pnp bipolar transistor. In one embodiment, the device may include a further p-type region separating the first n-type region from the second n-type region.

The device may be operable in at least three operating regions during an ESD event. The device may be operable to transition between the operating regions at a trigger current which separates each region from a neighbouring region. For instance, the device may be operable to transition from a first operating region to a second operating region at a first trigger current and the device may be operable to transition from the second operating region to a third operating region at a second trigger current. The second trigger current may be a larger current than the first trigger current. In accordance with embodiments of this disclosure, one or more different current paths may be taken through the device by an electrostatic discharge current. These current paths may correspond to operating regions of the kind noted above. The trigger currents may correspond the currents at which the dominant path of the electrostatic discharge current through the device changes.

In one embodiment, the device may be operable in a first operating region in which a current passing through the device takes a path from the first node passing through:

the emitter of the first pnp bipolar transistor;
the first n-type region;
the collector of the first pnp bipolar transistor;
the emitter of the second pnp bipolar transistor;
the second n-type region;

the collector of the second pnp bipolar transistor;
the p-type region of the pn junction diode, and
the third n-type region, to the second node.

In one embodiment, the device may be operable in a second operating region in which a current passing through the device takes a path from the first node passing through:
the emitter of the first pnp bipolar transistor;
the first n-type region;
the collector of the first pnp bipolar transistor;
the emitter of the second pnp bipolar transistor;
the second n-type region, and
the p-type region separating the second and third n-type regions, to the second node.

In one embodiment, the device may be operable in a third operating region in which a current passing through the device takes a path from the first node passing through:
the emitter of the first pnp bipolar transistor;
the first n-type region;
the collector of the first pnp bipolar transistor;
the emitter of the second pnp bipolar transistor;
the second n-type region;
the p-type region separating the second and third n-type regions, and
the third n-type region, to the second node.

In one embodiment, a trigger current of the device for transitioning from the second operating region noted above to the third operating region noted above may be larger than a trigger current of the device for transitioning from a first operating region (such as the first operating region noted above) to the second operating region.

One or each of the first and second pnp bipolar transistors each comprise a one or more sets of fingers forming the collector and emitter of that pnp bipolar transistor. Varying the dimensions and/or number of fingers in the two pnp bipolar transistors may allow the size of the two transistors to be altered, e.g. to make the first pnp bipolar transistor larger than the second pnp bipolar transistor.

The second pnp bipolar transistor and the pn junction diode may form an embedded silicon controlled rectifier (SCR) of the device. Accordingly, an embodiment of this disclosure may include an embedded SCR and need not include a dedicated or separate SCR.

The first and/or second nodes may each comprise a power supply rail or an I/O pad.

According to a further aspect of the invention, there is provided an integrated circuit including an electrostatic discharge protection device of the kind described above.

BRIEF DESCRIPTION OF THE DRAWINGS

Embodiments of the present disclosure will be described hereinafter, by way of example only, with reference to the accompanying drawings in which like reference signs relate to like elements and in which:

FIG. 1 shows the IV characteristic of a typical LVTSCR;
FIGS. 2A and 2B show two approaches to addressing latch-up in an LVTSCR.

DETAILED DESCRIPTION

Embodiments of the present disclosure are described in the following with reference to the accompanying drawings.

Embodiments of this disclosure can provide an electrostatic discharge (ESD) protection device for shunting an ESD current from a first node to a second node. The first and second nodes may be, for example, be I/O pads, power supply rails or pins of an integrated circuit incorporating the protection device. The device can include a first PNP bipolar transistor, a second PNP bipolar transistor and a PN junction diode. As will be described below, in accordance with embodiments of this disclosure, a trigger current of the ESD protection device may be tuned by selecting the size of the first PNP bipolar transistor. For instance, the first PNP bipolar transistor can be selected to be larger than second PNP bipolar transistor. In some embodiments, this can improve the ability of the ESD protection device to avoid latch-up, which may otherwise take place during testing of the device or during normal operation of a circuit incorporating the device (for example, caused by a noise pulse).

Figure 3:
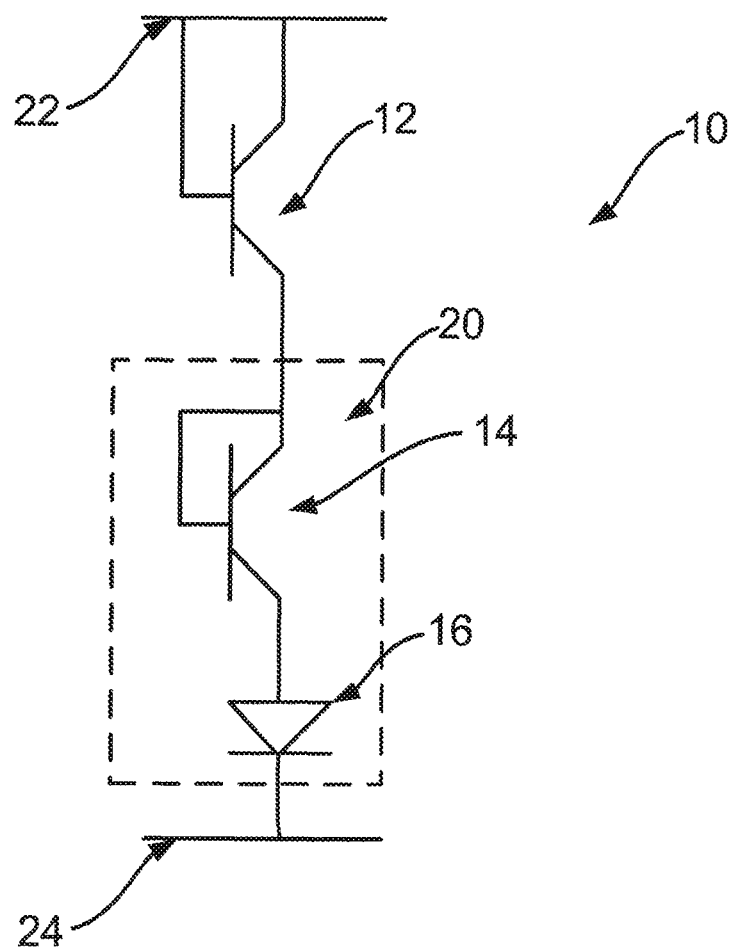
FIG. 3 shows an electrostatic discharge (ESD) protection device in accordance with an embodiment of the present disclosure.

FIG. 3 shows an ESD protection device in accordance with a first embodiment of this disclosure. In this example, the first node of the device comprises a first power rail 22 and a second power rail 24. The first power rail 22 may, for example, be a power supply rail and the second power rail 24 may be a ground rail.

The device includes a first PNP bipolar transistor 12. An emitter of the first PNP bipolar transistor is connected to the first power rail 22. The base of the transistor 12 is also connected to the first power rail 22.

The device 10 also includes a second PNP bipolar transistor 14. The collector of the first transistor 12 is connected to the emitter of the second transistor 14. The base of the second transistor 14 is also connected to the collector of the first transistor 12.

The device 10 further includes a PN junction diode 16. As will be described below, the PN junction diode 16 has a p-type region that is located in an n-type region for forming the PN junction. The p-type region of the PN junction diode 16 (the anode) is connected to the collector of the second transistor 14. The n-type region of the PN junction diode 16 (the cathode) is connected to the second power rail 24. As will be described in more detail below, the second transistor 14 and the PN junction diode 16 may collectively form a silicon controller rectifier 20 of the device 10. The silicon controller rectifier 20 (SCR) is embedded in the device 10, in contrast to ESD protection devices that use a dedicated SCR.

Figure 4:
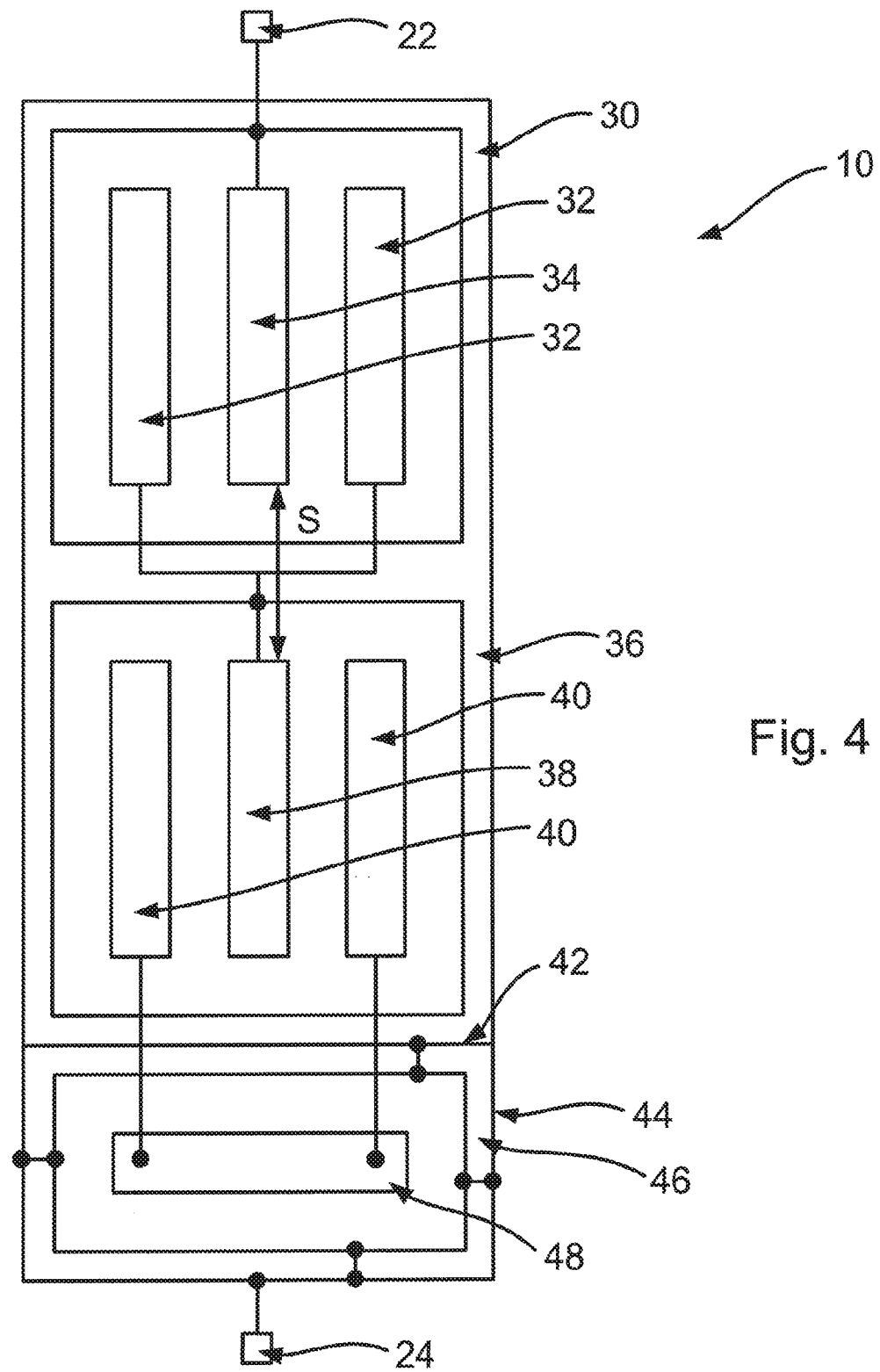
FIG. 4 shows an ESD protection device in accordance with an embodiment of the present disclosure.

FIG. 4 shows the layout of an ESD protection device 10 in accordance with an embodiment of this invention.

The device in this embodiment includes a p-type region 44 which may be provided as a ring which surrounds the first PNP bipolar transistor, the second PNP bipolar transistor and the PN junction diode. The p-type region can include a portion 42, which separates the second transistor from the PN junction diode of the device 10.

The first PNP bipolar transistor in this example includes a first n-type region 30 (which may be a drift region) within which are located a collector and an emitter of the transistor. The emitter of the first transistor may comprise one or more fingers 34 of p-type material and the collector may also comprise one or more fingers 32 of p-type material. In this example, a single emitter finger 34 and a pair of collector fingers 32 are provided, although it is envisaged that more fingers of this kind may be provided.

The second PNP bipolar transistor in this example includes a second n-type (which may be a drift region) region 36 within which are located a collector and an emitter of the second transistor. The emitter of the second transistor may comprise one or more fingers 38 of p-type material and the collector may also comprise one or more fingers 40 of p-type material. In this example, a single emitter finger 38 and a pair of collector fingers 40 are provided, although again it is envisaged that more fingers of this kind may be provided.

The PN junction diode in this example includes a p-type region 48 that is located in a third n-type region 46 (which may be a drift region). The portion 42 of the p-type region noted above may extend between the n-type drift region 46 of the PN junction diode and the n-type drift region 36 of the second transistor.

As shown in FIG. 4, the emitter finger 34 of the first PNP bipolar transistor is connected to a first node 22 of the circuit 10, which as explained above may be a power rail, an I/O pad or a pin of an integrated circuit incorporating the ESD protection device 10. In this embodiment, the first node 22 of the device 10 is also connected to the first n-type drift region 30 of the device 10.

FIG. 4 also shows that the collector fingers 32 of the first PNP bipolar transistor are connected to the emitter finger 38 of the second PNP bipolar transistor. In this embodiment, the collector fingers 32 of the first PNP bipolar transistor are also connected to the n-type drift region 36 of the second PNP bipolar transistor.

FIG. 4 further shows that the collector fingers 40 of the second PNP bipolar transistor are connected to the p-type region 48 of the PN junction diode. In this embodiment the third n-type drift region 46 is connected to the p-type region 44 that forms a ring around the transistors and the PN junction diode. The p-type region 44 of the device 10 is also connected to a second node 24 of the device 10, which again may be an I/O pad or power supply rail (e.g. ground rail) of an integrated circuit (the second node 24 should be lower potential than the first node 22).

Figure 5A:
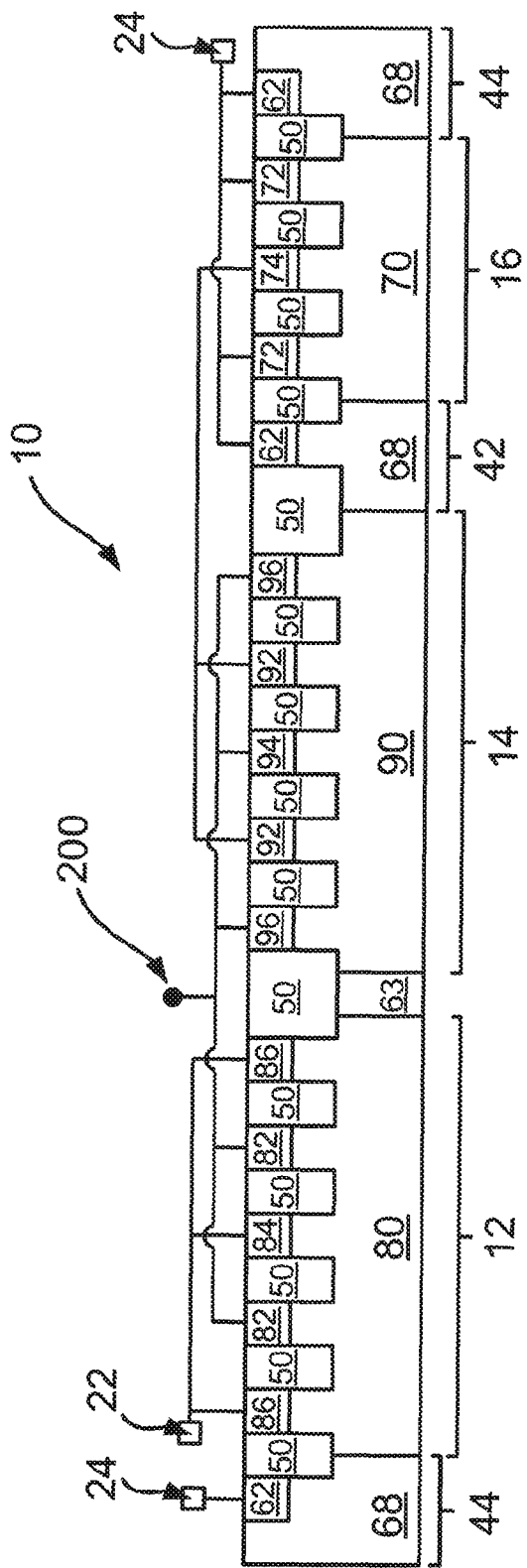
FIG. 5A shows an ESD protection device in accordance with an embodiment of the present disclosure.

FIG. 5A shows a schematic cross section of an ESD protection device 10 in accordance with an embodiment of this disclosure. The various parts of the device 10 described below in relation to FIG. 5A may be provided in a semiconductor substrate, for example a silicon substrate, which may be p-doped.

The components of the device 10 forming the first PNP bipolar transistor in this embodiment are shown generally at reference numeral 12 in FIG. 5A, the components of the second PNP transistor of the device 10 are shown generally at reference numeral 14 in FIG. 5A and the components of the PN junction diode at 16 of the device 10 are shown generally at reference numeral 16 in FIG. 5A.

The first PNP bipolar transistor 12 in this embodiment includes a p-type region 84 forming an emitter of the transistor 12. The first transistor 12 also includes one or more p-type regions 82 for forming the collector of the bipolar transistor 12. As noted above, the p-type regions forming the emitter and collector may be provided in the form of one or more fingers. The first bipolar transistor 12 also includes an n-type drift region 80 within which the p-type region 84 forming the emitter and the p-type regions 82 forming the collector of the transistor 12 are located. The p-type regions may be p+ regions (e.g. more highly doped than the n-type drift region 80). In this example, n+ regions 86 may be used to form contacts for the n-type drift region 80.

The second PNP bipolar transistor 14 in this embodiment includes a p-type region 94 forming an emitter of the transistor 14. The second transistor 14 also includes one or more p-type regions 92 for forming the collector of the transistor 14. As noted above, the p-type regions forming the emitter and collector may be provided in the form of one or more fingers. The second bipolar transistor 14 also includes an n-type drift region 90 within which the p-type region 94 forming the emitter and the p-type regions 92 forming the collector of the transistor 12 are located. Again, the p-type regions may be p+ regions (e.g. more highly doped than the n-type drift region 90). In this example, n+ regions 96 may be used to form contacts for the n-type drift region 90.

The PN junction diode 16 of the device 10 in this embodiment can include a p-type (e.g. p+) region 74. The p-type region 74 may be located in a third n-type drift region 70. The PN junction diode 16 of the device 10 may also include one or more n+ regions 72 for forming contacts to the third n-type drift region 70.

The p-type region 44 described above in relation to FIG. 4 is also shown in FIG. 5A. The p-type region 44 may comprise a ring of p-type material 68 that may surround the first and second PNP bipolar transistors 12, 14 and the PN junction diode 16. As shown in FIG. 5A, the portion 42 of the p-type region 44 separates the second PNP bipolar transistor 14 from the PN junction diode 16. In this example, the p-type material 68 of the portion 42 of the p-type region 44 is in contact with the second n-type drift region 90 of the second PNP bipolar transistor 14 and the third n-type drift region 70 of the PN junction diode 16 (the portion 42 is not electrically connected to the second n-type drift region 90 and the third n-type drift region 70 described below in relation to FIG. 5A, as otherwise there would be a short circuit for this device). The p-type material 68 of the p-type region 44 (including the portion 42) may be provided with one or more p+ regions 62 for providing contacts to the p-type material 68.

As shown in FIG. 5A, isolation regions 50 may be provided in the substrate for separating the regions 62, 82, 84, 86, 92, 94, 96, 72, 74. For instance, one or more isolation regions may separate the collector and emitter of each PNP bipolar transistor from each other and may also separate the collectors of each PNP bipolar transistor from the n+ contact regions 86 of each n-type drift region 80, 90. In the PN junction diode 16, one or more isolation regions 50 can be used to separate the p-type region 74 from the n+ contact regions 72 of the third n-type drift region 70. FIG. 5A also shows that isolation regions 50 may be provided to separate the PNP bipolar transistors 12, 14 from each other (for instance FIG. 5A shows the provision of an isolation region 50 for separating the n+ contact region 86 of the first PNP bipolar transistor 12 from the n+ contact region 96 of the second PNP bipolar transistor). FIG. 5A further shows that isolation regions 50 may be provided for separating the p+ contact regions 62 of the p-type region 44 from, for example, the n+ contact regions 72 of the PN junction diode 16 and the n+ contact regions 86, 96 of the PNP bipolar transistors 12, 14.

The isolation regions 50 may comprise dielectric. The isolation regions 50 may, for example, comprise shallow trench isolation (STI).

FIG. 5A further shows that a further p-type region 63 may be provided to separate the first n-type drift region 80 of the first PNP bipolar transistor 12 from the second n-type drift region 90 of the second PNP bipolar transistor 14. The p-type region 63 may be provided beneath an isolation region 50 that separates the first PNP bipolar transistor 12 from the second PNP bipolar transistor 14. The p-type region 63 may be part of the p-type region 44.

The p-type region 44 and also the p-type region 63 shown in FIG. 5A may, for example, be provided as a p-type well in the semiconductor substrate. The various p-type, n-type, n+ and p+ regions described above may, for instance, be formed using standard semi-conductor processing techniques such as ion implantation and diffusion.

FIG. 5A further shows a number of connections between the various parts of the device 10 in this embodiment. For instance, the p-type region 84 of the emitter of the first PNP transistor 12 of the device is connected to the first node 22 of the device. In this embodiment, the first node 22 is also connected to the n+ regions 86 that form the contact regions of the first n-type drift region 80. Accordingly, the base of the transistor 12 is connected to the first node 22, as noted above in relation to FIG. 3.

FIG. 5A also shows that the p-type region 94 forming the emitter of the second PNP bipolar transistor 14 of the device 10 is connected to the p-type regions 82 forming the collector of the first PNP bipolar transistor 12. The emitter of the second PNP bipolar transistor 14 may also be connected to the second n-type region 90. For instance, in this embodiment, the n-type regions 96 forming the contact regions of the second n-type drift region 90 are connected to the p-type regions 82 forming the collector of the first PNP bipolar transistor 12 and to the p-type region 94 forming the emitter of the second PNP. Accordingly, the base and the emitter of the transistor 14 are both connected to the collector of the transistor 12. The potential at the collector of the first transistor 12 and the emitter and base of the second transistor 14 (represented by the potential at node 200 in FIG. 5A) is referred to herein after as "VnetA".

FIG. 5A further shows that the p-type region 74 of the PN junction diode 16 is connected to the p-type regions 92 that form the collector of the second PNP bipolar transistor 14. Accordingly, the anode of the pn junction diode 16 is connected to the collector of the second transistor 14.

FIG. 5A also shows that the n+ regions 72 forming the connection regions of the third n-type drift region 70 of the PN junction diode 16 are connected to the second node 24 of the device. Accordingly, the cathode of the pn junction diode 16 is connected to the second node 24.

FIG. 5A further shows that the n+ regions 72 of the PN junction diode 16 are connected to neighbouring connection regions 62 of the p-type region 44 and that the connection regions 62 are also connected to the second node 24 of the device. Accordingly, the cathode of the pn junction diode 16 is also connected to the p-type region 44 (via the p-type connection regions 62).

Figure 5B:
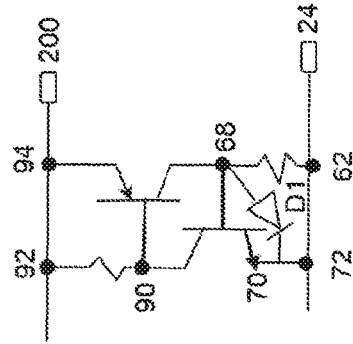
FIG. 5B shows an equivalent circuit for the device in FIG. 5A, illustrating how the various parts of the device may form an embedded silicon controlled rectifier.

FIG. 5B shows an equivalent circuit for the device in FIG. 5A, illustrating how the various parts of the device may form an embedded silicon controlled rectifier. In FIG. 5B, the various parts of the silicon controlled rectifier are specified using the same reference numerals as are used to specify the features of the device in FIG. 5A. The pn junction diode that is formed at the junction between the p-type material 68 of the portion 42 of the p-type region 44 and the third n-type region 70 is represented in FIG. 5B by the diode labelled D1.

An ESD protection device according to an embodiment of this disclosure may be operable in a plurality of operating regions. For instance, the device 10 described in relation to FIGS. 3 to 5 may be operable in three different operating regions. Each operating region may be associated with a different current path within the device (e.g. during an ESD event associated with zapping from the first node 22 to the second node 24 of the device 10). These current paths will be described herein below in relation to FIGS. 6A to 6C.

Figure 6A:
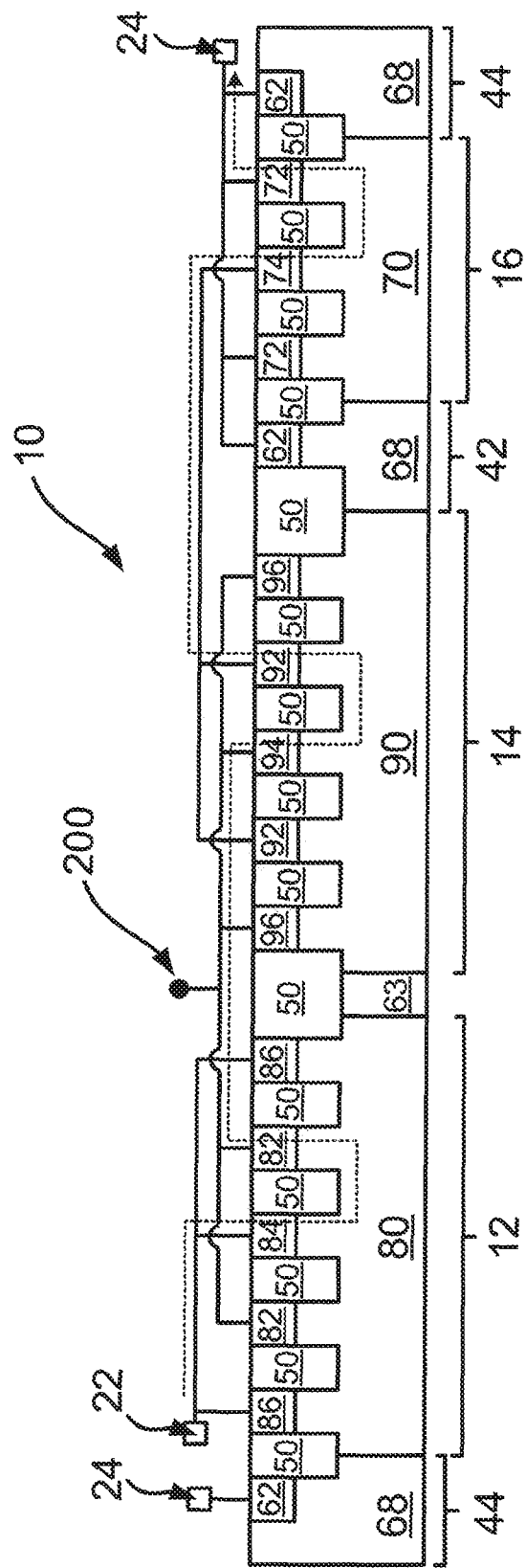
FIG. 6A shows the current path through an ESD protection device of the kind shown in FIG. 5A in a first mode of operation, in accordance with an embodiment of the present disclosure.

FIG. 6A shows a current path (represented by the dotted line) through the device 10 described above in relation to FIG. 5A in a first operating region of the device 10 in accordance with an embodiment of this disclosure. FIG. 6A shows the current path through the device 10 at relatively low currents—as will be described below in relation to FIGS. 6B and 6C, as the current through the device 10 increases, a different path may be taken.

In this operating region of the device 10, the current flows from the first node 22 into the emitter of the first transistor 12 and down into the first n-type drift region 80. The current exits via the collector of the first transistor 12 (in FIG. 6A it is shown that the current exits through one of the collector fingers, but it will be appreciated that it may exit through multiple collector fingers).

The current exiting the first transistor 12 then flows through the second transistor 14. The current from the collector of the first transistor 12 enters the emitter of the second transistor and flows into the second n-type drift region 90. The current exits via the collector of the second transistor 14 (in FIG. 6A it is shown that the current exits through one of the collector fingers, but it will be appreciated that it may exit through multiple collector fingers).

The current exiting the second transistor 14 then flows through the PN junction diode 16. In particular, the current from the collector of the second transistor 14 enters the p-type region 74 of the diode 16 and flows through the third n-type drift region 70 to exit the PN junction diode 16 through the n-type region(s) 72. The current exiting the PN junction diode 16 flows to the second node 24, which may, for example, be a ground rail.

As will be described below in relation to FIG. 7A, as the current within the device 10 increases during an ESD event, the path taken by the current may transition to the path shown in FIG. 6B (again, the current path is shown by the dotted line).

Figure 6B:
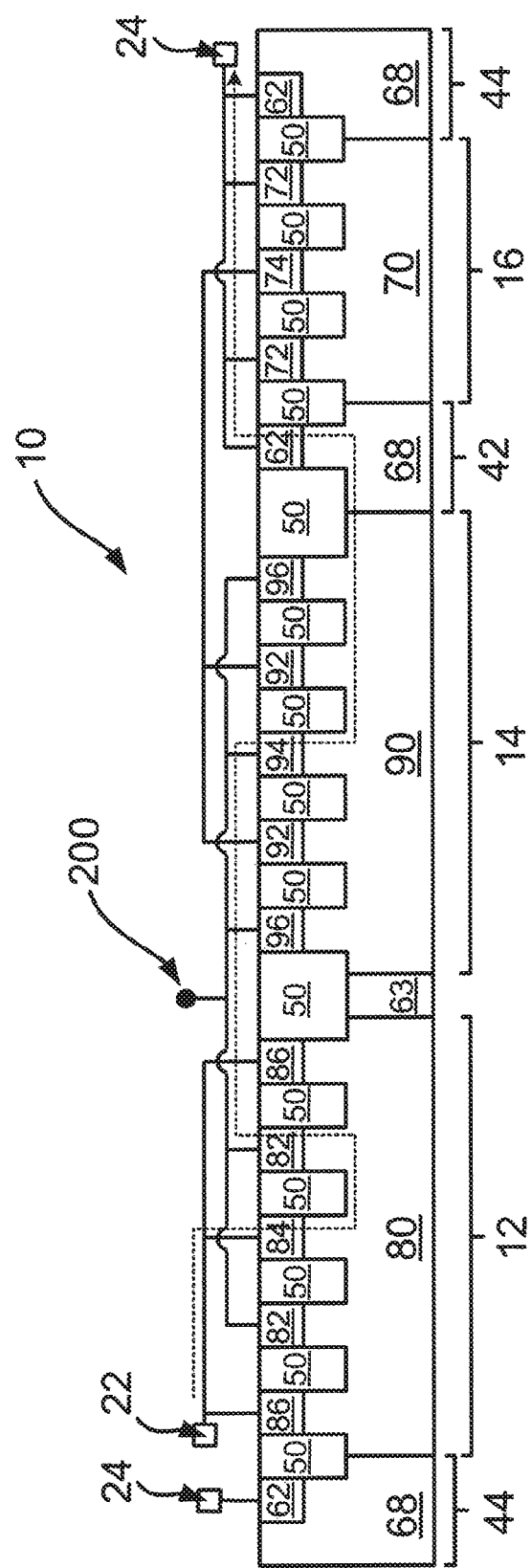
FIG. 6B shows the current path through an ESD protection device of the kind shown in FIG. 5A in a second mode of operation, in accordance with an embodiment of the present disclosure.
Figure 6C:
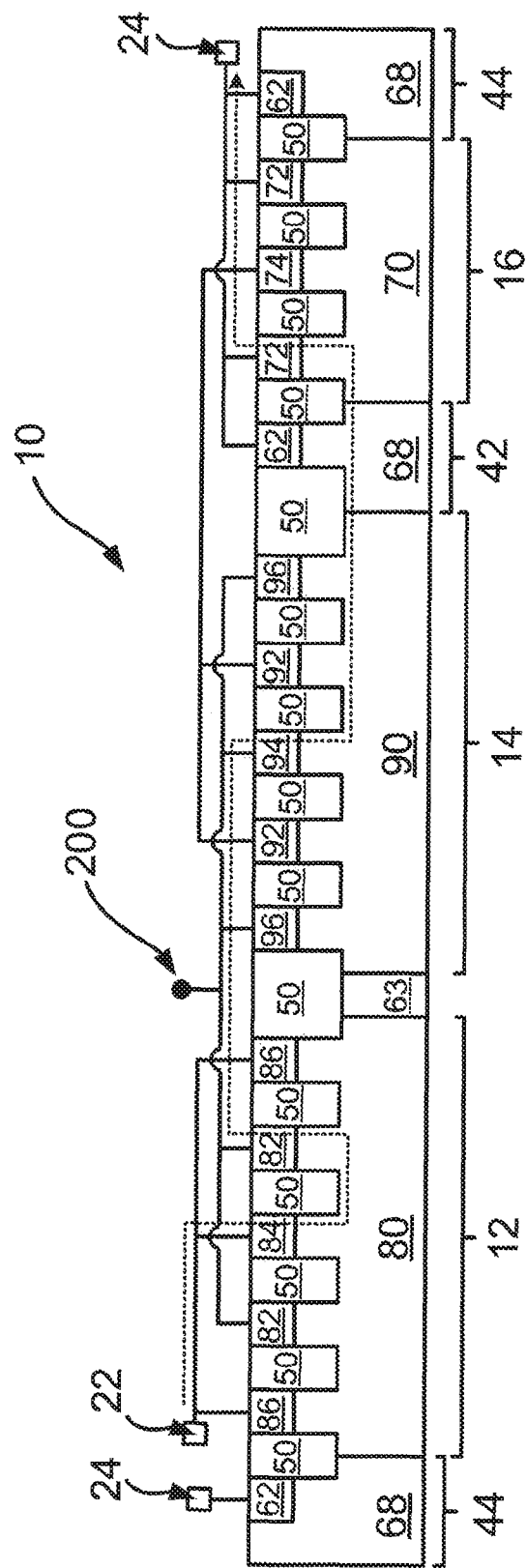
FIG. 6C shows the current path through an ESD protection device of the kind shown in FIG. 5A in a third mode of operation, in accordance with an embodiment of the present disclosure.

In common with the path taken by the current in FIG. 6A, the current path in FIG. 6B flows from the first node 22 into the emitter and out of the collector of the first transistor 12 via the first n-type drift region 80. The current exiting the first transistor 12 then enters the emitter of the second transistor 14 and passes through the second n-type drift region 90. Instead of exiting the second transistor 14 through the collector of the second transistor 14 as shown in FIG. 6A, in this second operating region of the device 10, the current passes through the second n-type drift region 90 into the portion 42 of the p-type region 44. The current then exits the portion 42 through the p+ contact region 62 thereof, and from there flows to the second node 24.

As the current through the device 10 continues to increase, the device 10 can transition to a third operating region, which has a third current path associated with it. This third current path is shown (again using a dotted line) in FIG. 6C.

The current path in FIG. 6C again flows from the first node 22 into the emitter and out of the collector of the first transistor 12. Again, the current then enters through the emitter of the second transistor 14 and flows through the second n-type drift region 90 into the portion 42 of the p-type region 44. Instead of exiting the p-type region 42 through the contact region 62 as shown in FIG. 6B, the current in this operating region of the device 10 passes into the third n-type drift region 70 of the PN junction diode 16. The current then exits the third n-type drift region 70 through the n+ region(s) 72 and flows to the second node 24.

Figures 7A, 7B:
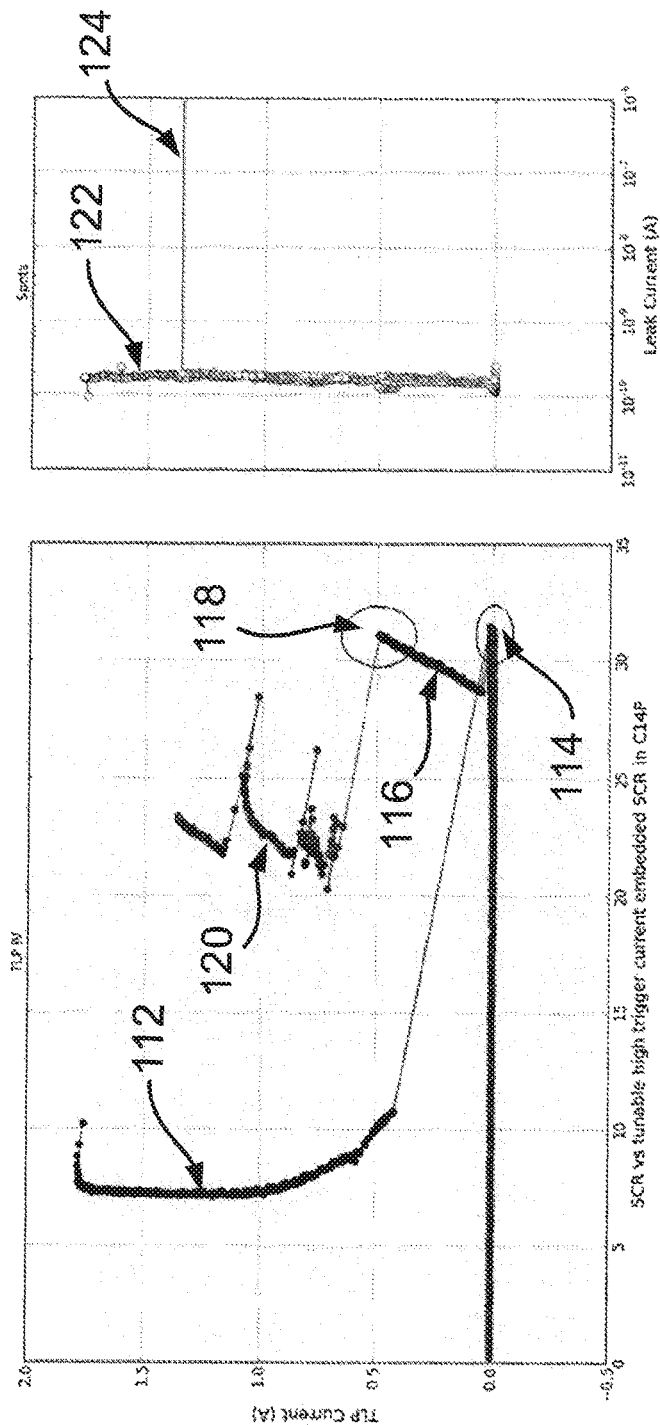
FIGS. 7A and 7B show transmission line pulse (TLP) plots for an ESD protection device in accordance with an embodiment of the present disclosure.

FIG. 7A shows a comparison of transmission line pulse (TLP) data of a conventional silicon controlled rectifier with transmission line pulse data for an ESD protection device in accordance with an embodiment of this disclosure. In FIG. 7A, the plot 112 corresponds to the conventional silicon controlled rectifier. The TLP data for an embodiment of this disclosure will be described below.

As noted above, the embodiment of FIGS. 5 and 6 is operable in three operating regions. The first operating region corresponds to relatively low currents (e.g. the device may enter the first operating region at the start of an ESD event, before the ESD current has risen substantially). As the current within the device increases, at point 114, the device transitions to the second operating region and the current path within the device switches to that shown in FIG. 6B. At this point, snapback occurs—the characteristics of the device in this second operating region are represented by the data points 116 in FIG. 7A. Subsequently, as the current within the device continues to increase, at point 118, the device reaches the trigger current for the embedded silicon control rectifier. At this point, snapback again occurs—the characteristic of the device in this third operation region are shown by the data points 120 in FIG. 7A. Note that the trigger current at point 118 in FIG. 7A corresponds to the point at which the potential in the p-type material 68 of the portion 42 of the p-type region 44 in FIG. 5A reaches a level at which the pn junction between the p-type material 68 and the third n-type region 70 (represented by the diode D1 in FIG. 5B) becomes forward biased. At this point, the embedded silicon controlled rectifier shown in FIG. 5B is activated.

Note that the trigger current of the SCR in accordance with an embodiment of this disclosure is higher than the trigger current of the conventional SCR represented by the plot 112. In the second operating region of the device, most of the current within the device may be dominated by the first PNP bipolar transistor 12, as this is the first component to sustain the ESD current from the first node 22. Accordingly, by increasing the size of the first bipolar transistor 12, the trigger current of the embedded silicon controlled rectifier may be increased. The first PNP transistor may be selected so that the trigger current of the ESD protection device is high enough to avoid latch up.

Returning to FIG. 4, it is also envisaged that by reducing the size of the space (indicated in FIG. 4 by the arrow marked "S") between the emitter finger 38 of the second PNP bipolar transistor 14 and the n-type region of the pn junction diode the holding voltage of the embedded silicon controlled rectifier may be decreased, and the failure current of the device can be increased.

FIG. 7B shows leakage current data for a device according to an embodiment of this disclosure (plot 124) compared again with a conventional silicon controlled rectifier (plot 122). In FIG. 7B, the final point in each plot corresponds to the failure current of the device, which may be a key performance parameter of the device for a given application.

Accordingly, there has been described an ESD protection device for shunting an ESD current from a first node to a second node, and an integrated circuit including the same. The device includes a first bipolar transistor having a collector and an emitter located in a first n-type region. The emitter of the first transistor is connected to the first node. The device also includes a second bipolar transistor having a collector and an emitter located in a second n-type region. The emitter of the second transistor is connected to the collector of the first bipolar transistor. The device further includes a pn junction diode including a p-type region located in a third n-type region. The p-type region of the diode is connected to the collector of the second bipolar transistor and the third n-type region is connected to the second node. The second n-type region is separated from the third n-type region by a p-type region. The p-type region is connected to the second node.

Although particular embodiments of the disclosure have been described, it will be appreciated that many modifications/additions and/or substitutions may be made within the scope of the claimed invention.

The invention claimed is:

1. An electrostatic discharge protection device for shunting an electrostatic discharge current from a first node to a second node, the device comprising:
   a first pnp bipolar transistor having a collector and an emitter located in a first n-type region in a semiconductor substrate, wherein the emitter of the first pnp transistor is connected to the first node;
   a second pnp bipolar transistor having a collector and an emitter located in a second n-type region in the semiconductor substrate, wherein the emitter of the second pnp transistor is connected to the collector of the first pnp bipolar transistor, and
   a pn junction diode comprising a p-type region located in a third n-type region in the semiconductor substrate, wherein the p-type region of the pn junction diode is connected to the collector of the second pnp bipolar transistor and wherein the third n-type region is connected to the second node,
   wherein the second n-type region is separated from the third n-type region by a p-type region, wherein the p-type region is connected to the second node.

2. The device of claim 1, wherein the first pnp bipolar transistor is larger than the second pnp bipolar transistor.

3. The device of claim 1, wherein the first n-type region of the first pnp bipolar transistor is connected to the first node.

4. The device of claim 1, wherein the second n-type region of the second pnp bipolar transistor is connected to the collector of the first pnp bipolar transistor.

5. The device of claim 1, further comprising a further p-type region separating the first n-type region from the second n-type region.

6. The device of claim 1, wherein the device is operable in at least three operating regions during an ESD (electrostatic discharge) event.

7. The device of claim 1, wherein the device is operable in a first operating region in which a current passing through the device takes a path from the first node passing through:
   the emitter of the first pnp bipolar transistor,
   the first n-type region,
   the collector of the first pnp bipolar transistor,
   the emitter of the second pnp bipolar transistor, the second n-type region,
the collector of the second pnp bipolar transistor,
the p-type region of the pn junction diode, and
the third n-type region, to the second node.

8. The device of claim 7, wherein the device is operable in a second operating region in which a current passing through the device takes a path from the first node passing through:
the emitter of the first pnp bipolar transistor,
the first n-type region,
the collector of the first pnp bipolar transistor,
the emitter of the second pnp bipolar transistor,
the second n-type region, and
the p-type region separating the second and third n-type regions, to the second node.

9. The device of claim 8, wherein the device is operable in a third operating region in which a current passing through the device takes a path from the first node passing through:
the emitter of the first pnp bipolar transistor,
the first n-type region,
the collector of the first pnp bipolar transistor,
the emitter of the second pnp bipolar transistor,
the second n-type region,
the p-type region separating the second and third n-type regions, and
the third n-type region, to the second node.

10. The device of claim 9, wherein a trigger current of the device for transitioning from the second operating region to the third operating region is larger than a trigger current of the device for transitioning from a first operating region to the second operating region.

11. The device of claim 1, wherein one or each of the first and second pnp bipolar transistors each comprise a one or more sets of fingers forming the collector and emitter of that pnp bipolar transistor.

12. The device of claim 1, wherein the second pnp bipolar transistor and the pn junction diode form an embedded silicon controlled rectifier of the device.

13. The device of claim 1, wherein at least one of the first and second nodes comprises a power supply rail.

14. The device of claim 1, wherein at least one of the first and second nodes comprises an I/O pad.

15. An integrated circuit comprising
an electrostatic discharge (ESD) protection device for shunting an electrostatic discharge current from a first node to a second node, the ESD protection device comprising:
a first pnp bipolar transistor having a collector and an emitter located in a first n-type region in a semiconductor substrate, wherein the emitter of the first pnp transistor is connected to the first node;
a second pnp bipolar transistor having a collector and an emitter located in a second n-type region in the semiconductor substrate, wherein the emitter of the second pnp transistor is connected to the collector of the first pnp bipolar transistor, and
a pn junction diode comprising a p-type region located in a third n-type region in the semiconductor substrate, wherein the p-type region of the pn junction diode is connected to the collector of the second pnp bipolar transistor and wherein the third n-type region is connected to the second node,
wherein the second n-type region is separated from the third n-type region by a p-type region, wherein the p-type region is connected to the second node.

* * * * *